(12) United States Patent
Fujii et al.

(10) Patent No.: US 7,827,521 B2
(45) Date of Patent: Nov. 2, 2010

(54) METHOD FOR MANUFACTURING SEMICONDUCTOR DEVICE

(75) Inventors: Gen Fujii, Kanagawa (JP); Erika Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 167 days.

(21) Appl. No.: 11/964,251

(22) Filed: Dec. 26, 2007

(65) Prior Publication Data

US 2008/0160649 A1    Jul. 3, 2008

(30) Foreign Application Priority Data

Dec. 27, 2006    (JP)    ............... 2006-351985

(51) Int. Cl.
*G06F 17/50*    (2006.01)
(52) U.S. Cl. ............... 716/21; 716/19; 716/20; 438/30; 438/149; 438/150
(58) Field of Classification Search ............ 716/19–21; 438/30, 149–150; 349/3, 106, 187
See application file for complete search history.

(56) References Cited

U.S. PATENT DOCUMENTS

| | | | |
|---|---|---|---|
| 6,557,964 B2 | 5/2003 | Kawatoko et al. | |
| 6,609,845 B1 | 8/2003 | Ninomiya | |
| 7,138,304 B2 | 11/2006 | Hirai | |
| 7,223,703 B2 * | 5/2007 | Sasaki | ............... 438/736 |
| 7,687,326 B2 * | 3/2010 | Morisue et al. | ............. 438/149 |
| 2005/0166411 A1 * | 8/2005 | Scorvo | ............... 33/471 |
| 2005/0196710 A1 * | 9/2005 | Shiroguchi | ............... 430/322 |
| 2007/0065957 A1 | 3/2007 | Fujii et al. | |

FOREIGN PATENT DOCUMENTS

| | | |
|---|---|---|
| JP | 2001-30478 | 2/2001 |
| JP | 2002-29097 | 1/2002 |
| JP | 2005-12179 | 1/2005 |
| JP | 2007-116119 | 5/2007 |

\* cited by examiner

*Primary Examiner*—Nghia M Doan
(74) *Attorney, Agent, or Firm*—Husch Blackwell LLP Welsh Katz

(57) ABSTRACT

When a design diagram of the semiconductor device by a conventional CAD tool is used, a pattern which can be formed with the ink-jet apparatus is limited; therefore, there is a possibility that some circuits of the desired semiconductor device cannot be formed as they are designed. A plurality of basic patterns which can be obtained by discharging with the ink-jet apparatus are prepared, and layout of a desired integrated circuit is performed by combining the patterns. A light-exposure mask is formed based on the layout obtained. Light exposure is performed using the light-exposure mask. Then, development is performed, and the resist film remains in the light-exposed region of which width is narrower than the diameter of the droplet landed. Liquid repellent treatment is performed to an exposed portion on the surface, and then the material droplet is dropped over the resist film. Discharging is selectively performed by a droplet discharging method to form a wiring of which width is narrower than the dot diameter.

10 Claims, 13 Drawing Sheets

FIG. 3A

| | A1 | A2 | Number of Pitches (Y direction) | Number of Pitches (X direction) |
|---|---|---|---|---|
| Block A |  |  | 4, 5 | 1 |

FIG. 3B

| | B1 | B2 | Number of Pitches (Y direction) | Number of Pitches (X direction) |
|---|---|---|---|---|
| Block B |  |  | 2, 3 | 1 |

FIG. 3C

| | C1 | C2 | Number of Pitches (Y direction) | Number of Pitches (X direction) |
|---|---|---|---|---|
| Block C |  |  | 2, 3 | 1 |

FIG. 3D

| | D1 | Number of Pitches (Y direction) | Number of Pitches (X direction) |
|---|---|---|---|
| Block D |  | 1 | 1 |

FIG. 3E

| | E1 | E2 | Number of Pitches (Y direction) | Number of Pitches (X direction) |
|---|---|---|---|---|
| Block E |  |  | 1 | 1 |

FIG. 3F

| | F1 | F2 | F3 | F4 | Number of Pitches (Y direction) | Number of Pitches (X direction) |
|---|---|---|---|---|---|---|
| Block F |  |  |  |  | 1 | 1 |

601

602

METHOD FOR MANUFACTURING SEMICONDUCTOR DEVICE

BACKGROUND OF THE INVENTION

1. Field of the Invention

The present invention relates to a semiconductor device having a circuit which includes a thin film transistor (hereinafter referred to as a TFT), and a manufacturing method thereof. For example, the present invention relates to an electronic appliance in which an electro-optical device typified by a liquid crystal display panel or a light-emitting display device having an organic light-emitting element is mounted as a part thereof.

Applicants claim priority under 35 U.S.C. §119 to the following foreign application: Serial no. 2006-351985 filed Dec. 27, 2006 in Japan.

In this specification, the semiconductor device refers to all devices that can function by using semiconductor characteristics, and an electro-optical device, a semiconductor circuit, and an electronic appliance are all included in the semiconductor device.

2. Description of the Related Art

In recent years, attention has been focused on a technique for forming a thin film transistor (TFT) using a semiconductor thin film (with a thickness of about several nm to several hundred nm) formed over a substrate having an insulating surface. The thin film transistor is widely applied to electronic devices such as an IC and an electro-optical device. In particular, the thin film transistor has been hurriedly developed as a switching element of an image display device.

In manufacturing of an electronic appliance having a semiconductor circuit, in order to improve efficiency for mass production, a mother glass substrate is used instead of a wafer substrate and a plurality of devices are often taken from one mother glass substrate. A mother glass substrate has a size of 300×400 mm for the first generation in the beginning of 1990, which has grown to 680×880 mm or 730×920 mm for the fourth generation in 2000. Production techniques have progressed, so that a plurality of devices, typically display panels, can be taken from one substrate.

Hereafter, in a film formation method using a spin coating method, the increase in size of a substrate will be disadvantageous in mass production because a mechanism for rotating a large substrate becomes large, and loss and waste amount of a material liquid increase. Further, when a film is formed by spin-coating a rectangular substrate, the film is likely to be formed unevenly and become circular with the center at a rotating axis. It is also difficult to adjust an apparatus used in a screen printing method to the increase in size of the substrate.

A droplet discharging technique typified by a piezo method or a thermal jet method, or a serial droplet discharging technique has attracted attention in recent years. This droplet discharging technique has been used in printing type and drawing an image; however, an attempt to apply the droplet discharging technique to a semiconductor field such as wiring pattern formation has begun in recent years. For example, a method for forming a wiring pattern by a droplet discharging technique is disclosed in Patent Document 1: Japanese Published Patent Application No. 2005-12179.

SUMMARY OF THE INVENTION

When a semiconductor device is manufactured, first, a mask for the semiconductor device is designed by a CAD tool. This mask design is a design to manufacture masks with which layers of various materials are stacked by a sputtering method, a plasma CVD method, or the like and the layers are etched selectively.

A droplet discharging apparatus which is a formation method without using masks, typically an inkjet apparatus, controls a discharging position of a material droplet based on raster data which is obtained by binarizing data and which decides whether the droplet is discharged or not. An inkjet head of the ink-jet apparatus has a plurality of discharging outlets in a line or in a plurality of lines. A surface to be discharged (e.g. a surface of a glass substrate) and the head are moved relatively, whereby a droplet is selectively discharged from a desired discharging outlet. A direction in which the plurality of discharging outlets are arranged is made perpendicular to a direction in which the surface to be discharged and the head are moved relatively, whereby scanning of the head is performed over the surface to be discharged. The raster data is a plurality of data which are arranged in a direction in which the surface to be discharged is moved, that is, a direction (a row direction) perpendicular to a printing direction, and each of the raster data can be arranged in each corresponding column, whereby a raster bitmap can be made. When a complex integrated circuit is formed, it is difficult to understand a circuit structure or a wiring arrangement, only from this raster data and this raster bitmap. Further, it is also difficult to design the complex integrated circuit only by using the raster data or the raster bitmap from the beginning.

When an ink-jet apparatus is used, a diameter d of a droplet landed is determined based on discharging capacity of a head, a material of a droplet discharged from a nozzle, a surface condition of a substrate, or the like. The material of a droplet is acceptable as long as it has fluidity (viscosity) that can be discharged from a nozzle or the like and to be a fluid as the whole droplet even if a solid substance is mixed therein. An ink-jet apparatus has a plurality of nozzles in one head. Scanning is carried out by relatively moving the head and a substrate to be processed, and whether the material droplet is discharged from a nozzle or not is selected. For example, scanning may be carried out by moving the substrate to be processed with the head fixed, or by moving the head with the substrate to be processed fixed.

If the diameter d of the droplet landed is determined, a width of a line which can be obtained is almost determined as well. Accordingly, limitation of narrowness of the width of the line which can be obtained with the ink-jet apparatus largely depends on the head. If a minute wiring or the like is desired to be formed with the ink-jet apparatus in manufacturing of an electric circuit, a head with which a line width of the minute wiring can be obtained needs to be prepared. As a nozzle diameter of the head is smaller and more delicate, higher processing accuracy is needed, which makes the head expensive. Further, when a plurality of lines are desired to be obtained at close intervals with the ink-jet apparatus, the droplet discharged from the head of the ink-jet apparatus spreads on the surface to be processed after landing; therefore, it is difficult to form a plurality of lines in a high density in a certain area.

When a design drawing of the semiconductor device by a conventional CAD tool is used, since a pattern which can be formed with the inkjet apparatus is limited, there is a possibility that some circuits of the desired semiconductor device cannot be formed as they are designed.

To solve at least one of the above problems and form a line of which width is narrower than the diameter d of the droplet landed discharged from the head, liquid repellent treatment or lyophilic treatment is performed to the surface to be processed in advance, so that a minute line can be obtained.

However, even if a line which is narrower than the diameter d of the droplet landed can be formed, the ink-jet apparatus is not designed so as to form a line which is narrower than the diameter d of the droplet landed; therefore, it is difficult to form a complex pattern including a line which is narrower than the diameter d of the droplet landed using a mechanism for driving the head.

Therefore, when a desired wiring is formed, a light-exposed region is designed in advance by combining a plural kinds of basic patterns, with which a wiring can be formed by discharging a droplet with the ink-jet apparatus.

That is, without using the conventional CAD tool, a plurality of basic patterns which can be obtained by discharging a droplet with the ink-jet apparatus are prepared, and layout of a desired integrated circuit is performed by combining the patterns. Thus, designing time of layout of the integrated circuit can be shortened. A light-exposure mask is formed based on the layout obtained. Accordingly, this light-exposure mask is formed in accordance with a design rule where a size smaller than that of the droplet discharged with the ink-jet apparatus (greater than or equal to 50% and less than 90%) is considered as one unit. Then, a negative type resist film with a small thickness is formed over the surface to be processed, and light exposure is performed using the light-exposure mask. Then development is performed, and the resist film remains in the light-exposed region of which width is narrower than the diameter of the droplet landed. Liquid repellent treatment is performed to an exposed part on the surface to be processed, the material droplet is dropped over the resist film. Discharging is selectively performed by a droplet discharging method to form a wiring of which width is narrower than the diameter of the droplet landed. The width of the wiring obtained depends on accuracy of light exposure before performing liquid repellent treatment, not the diameter of the droplet landed.

Thus, a wiring of which width is narrower than the diameter of the droplet landed can be formed and a conventional etching step can be omitted. Further, since an ink-jet method is used, a material can be used efficiently. Conventionally, a metal film is formed over the entire surface of the substrate, and then the metal film is selectively removed by wet etching or dry etching using a photolithography technique to form a wiring; therefore, loss of a material is large and a process thereof is complex. Further, depending on etching conditions, there is a possibility that etching is performed to a material layer in addition to the metal film which is desired to be etched.

For mass production, it is greatly advantageous to omit a conventional etching step. An etching apparatus is not required, and influence of etching to another layer does not need to be worried. The kinds of materials which can be used for manufacturing the semiconductor device can be increased.

The present invention is not limited to using the negative type resist film, and a positive type resist film can be used. When the positive type resist film is used, a resist film with a small thickness is formed over a surface to be processed. Then light exposure is performed using a light-exposure mask, and then development is performed to expose a part of the surface to be processed. Lyophilic treatment is performed to the exposed part of which width is narrower than the diameter of the droplet landed, and then the resist is removed. Discharging is selectively performed by a droplet discharging method to form a wiring of which width is narrower than the diameter of the droplet landed.

Further, the present invention is devised in making the raster data. The raster data with which discharging is performed to all coordinate squares corresponding to a pattern to be obtained is not made. In the present invention, the number of discharging droplets is reduced in accordance with a basic pattern and the number of basic patterns in series to determine the most suitable number of discharging droplets. When a plurality of lyophilic regions of which widths are narrower than the diameter of the droplet are arranged, one droplet can be divided and a plurality of wirings can be obtained efficiently. For example, a thin wiring is not placed so that a distance between a thick wiring and the thin wiring is more than the diameter of the droplet landed. The distance between the thick wiring and the thin wiring is set closer than the diameter of the droplet landed, whereby the wirings can be obtained efficiently.

That is, the raster data, in the same manner as the light-exposure mask, is formed in accordance with a design rule where a size smaller than that of the droplet discharged with the ink-jet apparatus (greater than or equal to 50% and less than 90%) is considered as one unit. Thus, the raster data is made and the droplet discharging apparatus is driven using the raster data, so that a complex pattern including a thin line of which width is narrower than the diameter d of the droplet landed is formed. In particular, droplet discharging with the use of this method is useful when a complex pattern, for example, an electrode of which shape is complexly curved or branched is formed.

One aspect of the present invention disclosed in this specification is a method for manufacturing a semiconductor device including the steps of measuring the diameter of a droplet landed over a surface to be processed using a droplet discharging apparatus, determining a rectangular component having a side which is smaller than the diameter of the droplet on one side, partitioning a region corresponding to an area of the substrate to be processed into the plurality of rectangular components to make a data map where the rectangular components are arranged in an X coordinate and a Y coordinate, designing a circuit by selecting a diagram block from a diagram registering library having a plural kinds of diagram blocks, arranging the diagram block in the data map to make a diagram data map, making a light-exposure mask based on the diagram data map, forming a first region and a second region which have different wettabilities over the substrate to be processed using the light-exposure mask, making a raster data based on the diagram data map and the diagram registering library, and discharging a droplet in the first region with the droplet discharging apparatus in accordance with the raster data.

In the aspect described above, a plural kinds of the diagram blocks determined in advance are stored in the diagram registering library.

In the aspect described above, the first region has a lyophilic property, and the second region has a repellent property.

In the aspect described above, one side of the rectangular component is greater than or equal to 50% and less than 90% of the diameter of the droplet.

Another aspect of the present invention is a method for manufacturing a semiconductor device where at least a wiring is formed with a droplet discharging apparatus over a substrate having an insulating surface. The method for manufacturing the semiconductor device includes the steps of dropping a droplet including a conductive material, which is to be landed over a surface of the substrate having the insulating surface in a later step, over a substrate to measure a diameter of the droplet with the droplet discharging apparatus, and measuring the diameter of the droplet; forming a mask where the rectangular component having a length of greater than or equal to 50% and less than 90% of the diameter of the droplet including the conductive material on one side is considered as one unit; selectively forming a region which has a lyophilic property or a region which has a repellent property over the substrate having the insulating surface using the mask; making the raster data where the rectangular component having a side with the same length as the rectangular component of the mask is considered as one unit; discharging the droplet including the conductive material based on the raster data; and forming a wiring of which width is narrower than the diameter of the droplet.

In the aspect described above, the droplet discharging apparatus is provided with a head having a plurality of nozzles. A head tilt angle θ formed by a longitudinal direction and a sub scanning direction of the head of the droplet discharging apparatus is determined. Second raster data in which discharging timing of each nozzle has been corrected based on the head tilt angle θ is made. The head and the substrate are relatively moved in a main scanning direction or the sub scanning direction while maintaining the head tilt angle θ, so that the droplet is discharged based on the second raster data to form the wiring over the substrate having an insulating surface.

In the aspect described above, the diagram registering library has at least a first diagram block and a second diagram block. The first diagram block is a portion where a wiring of which width is wider than the diameter of the droplet is arranged. The second diagram block is a portion where a wiring of which width is narrower than the diameter of the droplet is arranged.

In the aspect described above, the diagram registering library has at least the first diagram block and the second diagram block. For example, binary data corresponding to the first diagram block is "1". When three second diagram blocks are arranged in series, binary data corresponding to the second diagram blocks is "0, 1, 0".

In the aspect described above, the diagram registering library has at least the first diagram block and the second diagram block. For example, binary data corresponding to the first diagram block is "1". When five second diagram blocks are arranged in series, binary data corresponding to the second diagram blocks is "0, 0, 1, 0, 0".

When a plurality of lines are desired to be obtained, an interval at which favorable lines can be formed (dot pitch dp in a direction perpendicular (or parallel) to the scanning direction) is in the range of about 0.5 to 0.9 times (greater than or equal to 50% and less than 90%) the diameter d of the droplet landed (also referred to as a dot diameter). In the present invention, this size is considered as one unit for forming the mask and making the raster data. When one unit is as small as less than 50% of the diameter of the droplet, the interval between the droplets is too narrow, and an area where the droplet landeds are overlapped increases, so that a plurality of droplets aggregate. When one unit is as large as greater than or equal to 90% of the diameter of the droplet, the interval between the droplets to be dropped increases, resulting in difficulty in obtaining a plurality of wirings in high density. In this specification, when the shape of the droplet landed is circular, the diameter d of the droplet landed refers to a diameter. When the shape of the droplet landed is elliptical, the diameter d of the droplet landed refers to not a minor axis but a major axis. The shape of the droplet landed is not limited to a circular shape or an elliptical shape. When the shape of the droplet landed is complex, the diameter d refers to total length.

Considering an area with this dot pitch dp on one side (dot pitch Xdp in a direction perpendicular to the scanning direction×dot pitch Ydp in a direction parallel to the scanning direction) as one unit, the data map is made, and the mask and the raster data are made.

The above methods are not just designing points but a point invented as a result of a deep consideration by the inventors after forming a wiring with the droplet discharging apparatus, manufacturing and driving the semiconductor device that uses the wiring.

Further, the above methods are not limited to forming the wiring. The above methods can be used for various portions and the like which are used for an antenna or a semiconductor element.

The mask and the raster data are designed in accordance with an area of a droplet landed, which is discharged from the droplet discharging apparatus; therefore, the most suitable layout of a circuit can be performed in a case where a pattern is formed using the droplet discharging apparatus.

BRIEF DESCRIPTION OF THE DRAWINGS

In the accompanying drawings:
FIGS. 3A to 3F show an example of a diagram registering library.

DETAILED DESCRIPTION OF THE INVENTION

Embodiment modes of the present invention will be explained below.

Embodiment Mode 1

Figure 1:
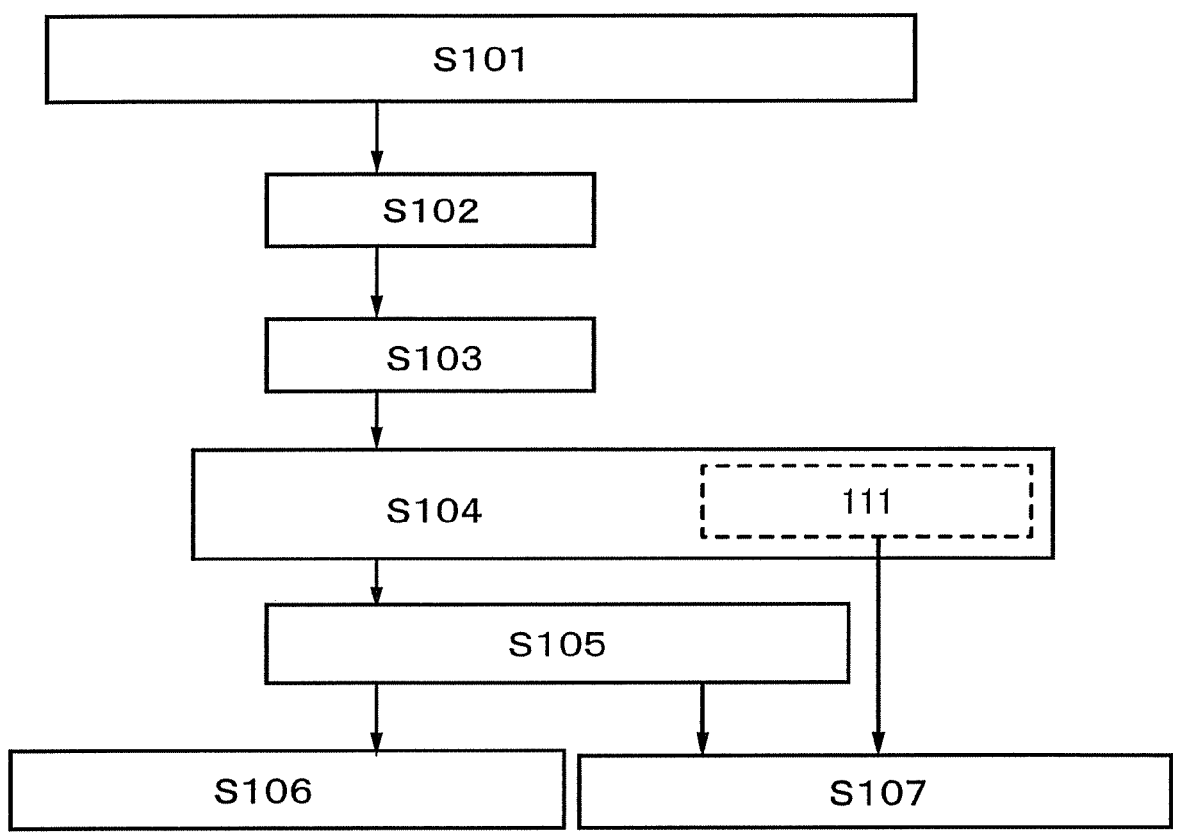
FIG. 1 is a diagram showing flow.

In this embodiment mode, procedures of manufacturing a mask and making raster data will be explained with reference to FIG. 1.

First, a droplet is discharged over a surface to be processed by a droplet discharging apparatus, and measurement of a diameter d of the droplet landed is performed (S101). By measurement of the diameter d of the droplet, a design unit of the mask and the raster data is determined.

Next, coordinates are made regarding a size of greater than or equal to 50% and less than 90% of the diameter d of the droplet as one unit (S102). Here, this one unit is referred to as a dot pitch, and each block of the coordinates is a square element having a dot pitch dpx (a main scanning direction)×a dot pitch dpy (a sub scanning direction). However, one element of the coordinates is not limited to a square and may have a rectangle where dpx≠dpy.

Next, a circuit is designed in order to determine arrangement or the like of a wiring to be obtained using a droplet discharging apparatus (S103). Here, a rough layout is made, and what circuit should be formed is determined.

Next, in accordance with the rough circuit design, registered diagrams are selected from a diagram registering library 111 where diagrams are registered in advance, and the registered diagrams selected are synthesized appropriately (S104). Note that pattern shapes are stored in the diagram registering library in advance by a practitioner, which can be obtained by a droplet discharging method after selectively treating a surface using a mask.

FIGS. 3A to 3F show examples of the registered diagrams. A total number of coordinate squares which are necessary to each of these registered diagrams is determined in advance. The most suitable number of coordinate squares depends on a material to be discharged and viscosity thereof; therefore, discharging is actually performed using the droplet discharging apparatus, and the most suitable number of coordinate squares is checked by a practitioner in advance. Further, from each number of coordinate squares, a most suitable discharging number can be determined, and most suitable raster data can be made.

In FIGS. 3A to 3F, the registered diagrams correspond to square elements; however, the registered diagrams are not limited in particular, and a group of a plurality of square elements may be considered as one registered diagram. If a group of a plurality of square elements is one registered diagram, a burden to a practitioner can be reduced in designing.

The registered diagrams are selected, and the registered diagrams selected are synthesized appropriately, which is repeated. The registered diagrams are arranged in places where they should be to create a diagram map, and the diagram map is written to storage means (S105).

The mask is formed and the raster data is made using the data of the diagram map stored in the storage means.

Next, the mask is formed based on the diagram map which is formed (S106). In addition, the raster data is made based on the diagram map (S107).

The mask and the raster data are formed through the above steps. Accordingly, both of the mask and the raster data are formed based on the coordinate squares which have the same size, that is, the coordinate squares with greater than or equal to 50% and less than 90% of a droplet size. The mask and the raster data are designed in accordance with an area of a droplet landed which is discharged from the droplet discharging apparatus; therefore, the most suitable layout of a circuit can be performed in a case where a pattern is formed using the droplet discharging apparatus.

Embodiment Mode 2

Figure 2:
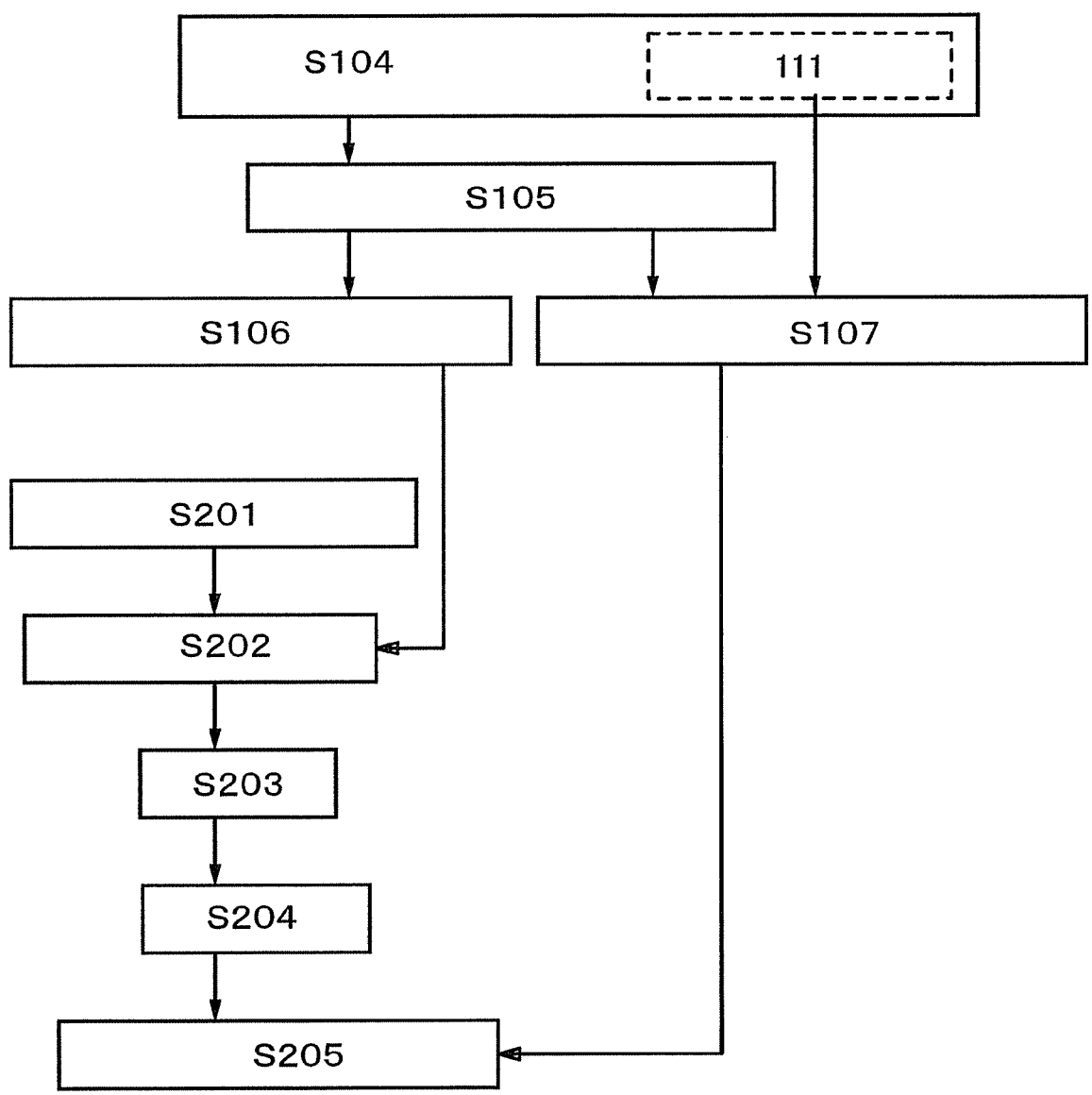
FIG. 2 is a diagram showing flow.

Here, flow until a droplet of a conductive material is discharged over a surface to be processed will be explained with reference to FIG. 2. Note that the same reference numerals are used for parts which are in common with FIG. 1. A method for forming a wiring mainly containing silver by discharging a droplet including silver nanoparticle over the surface to be processed of a glass substrate will be explained hereinafter.

First, a resist is applied over the surface to be processed (S201). As a resist material, a positive type resist or a negative type resist is used. Here, a glass substrate of which surface to be processed is formed of an inorganic material is used. In order to improve adhesiveness with the silver nanoparticle, the negative type resist is used.

Figure 4A:
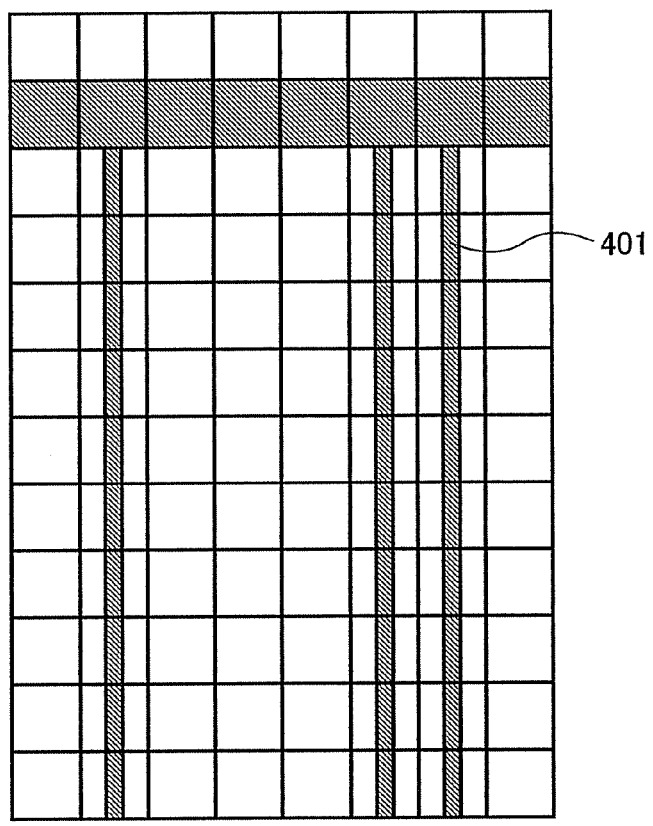
FIGS. 4A and 4B show an example of a mask design diagram and raster data.

Next, light exposure is performed using the mask formed in Embodiment Mode 1 as a light-exposure mask (S202). FIG. 4A shows an example of a layout of the mask. The light-exposure mask is a light shielding mask which has an opening in a place shown by a shaded portion 401 in FIG. 4A. In FIG. 4A, a block pattern A1 and a block pattern D1 selected from the diagram registering library which are shown in FIGS. 3A and 3D are arranged in the coordinate squares.

Next, a resist film is developed (S203). Since the negative type resist is used, the resist in a region to which light exposure is performed remains, and the resist in a region to which light exposure is not performed is removed using a developer.

Next, surface treatment is performed so that the surface which is exposed is modified (S204). This surface treatment refers to a treatment for adjusting wettability of the surface of a formation region. The wettability of a surface of a solid that is a substance to be formed is affected by the chemical property of the surface. If the substance has low wettability against a fluid composition, then the surface becomes a region having low wettability against the fluid composition (hereinafter also referred to as a low wettability region). On the other hand, if the substance has high wettability against the fluid composition, then the surface becomes a region having high wettability against the fluid composition (hereinafter also referred to as a high wettability region).

For example, the surface which is exposed, that is, a region where a wiring is not formed (a first region) is made to be a region having low wettability. In a later step, a droplet of a conductive material is dropped to a region where a wiring is formed (a second region), that is, a region having higher wettability than that of the first region. In the region having high wettability, a contact angle is small; therefore, the fluid composition spreads on the surface. In the other region, that is, a region having low wettability, the contact angle is large; therefore, when a droplet of the conductive material is discharged to the region having low wettability in the later step, the droplet is repelled. Note that in the surface treatment here, the surface treatment is not particularly limited as long as the first region and the second region which have different wettabilities against the fluid composition discharged in the later step are formed.

Figure 4B:
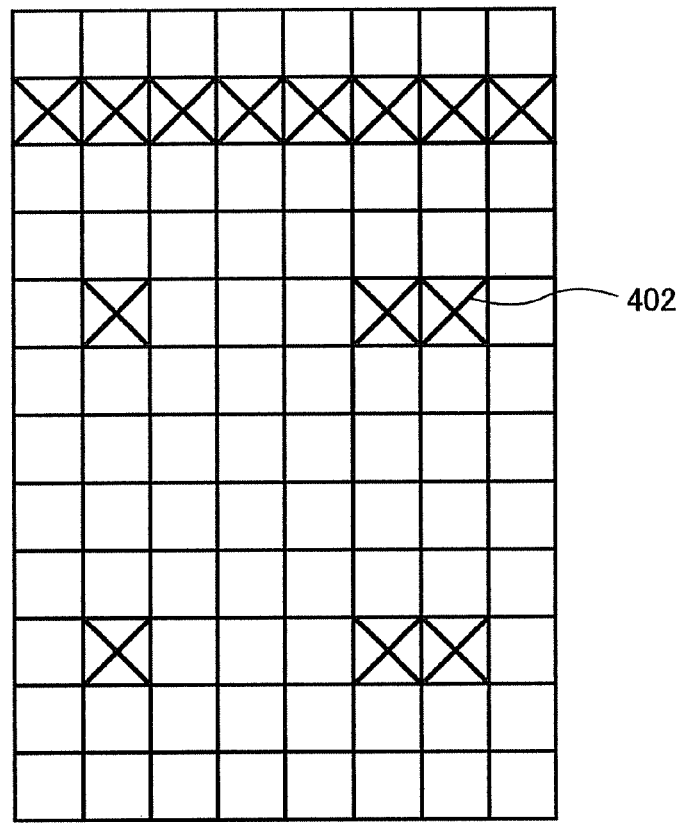

Next, the droplet of the fluid composition, here, the conductive material including a silver nanoparticle is discharged over the region where the negative type resist remains. Here, the droplet discharging apparatus is driven using the raster data made in the Embodiment Mode 1, the droplet of the conductive material is selectively discharged (S205). FIG. 4B shows an example of the raster data corresponding to FIG. 4A. A droplet is discharged to each place so as to correspond to places 402 which are marked with X in FIG. 4B. Discharging is performed the same number of times as the number of patterns to the places corresponding to the block pattern D1. Discharging is performed once for five continuous pitches to the places corresponding to the block pattern A1. When the diagram registering library is formed, a practitioner examines and confirms that four or five continuous block patterns A1 are preferably formed in a Y direction, and that one droplet is discharged in the middle of them.

As the droplet discharging apparatus, typically, an ink-jet apparatus is used. The ink-jet apparatus is provided with a head having an A number of nozzles (A is an integer of 2 or more) in a row, and droplets are discharged from different nozzles by changing a relative position between the head and an object to be processed, here a substrate. The ink-jet apparatus discharges a droplet of a material based on binarized or multi-valued data. After discharging, the wiring is formed by drying or baking. The droplet is discharged in accordance with the raster data shown in FIG. 4B, whereby a wiring pattern with almost the same size as the shaded portions 401 shown in FIG. 4A can be obtained.

Through the above steps, the pattern of the conductive material is formed. That is, the negative type resist film is formed over the glass substrate, and the wiring mainly containing silver is formed thereover.

Further, discharging control with high accuracy can be achieved by correcting the raster data. For example, data correction is made in consideration of a head tilt angle θ which is one of parameters which causes the displacement of a discharging position.

In order to increase the design efficiency, the inkjet apparatus may be provided with a computer electrically connected thereto. A program by which the diagram registering library is made, a plurality of diagrams selected from the diagram registering library are made to design diagram data of an electric circuit, and desired raster data is made automatically based on the design diagram data and the diagram registering library, may be created and executed using the computer.

The area of the droplet landed to the surface to be processed, which is a reference to determine the coordinates at first may be photographed automatically by a photographing device such as a CCD, and the data may be input into the computer. Alternatively, the area of the droplet landed may be photographed manually in each case, and the data may be input into the computer. Further, data relating to parameters such as the viscosity of the droplet and an angle θ between the major axis of the head and the direction perpendicular to the main scanning direction, that is, a sub scanning direction may be stored in a memory or the like in advance.

This embodiment mode can be freely combined with Embodiment Mode 1.

Embodiment Mode 3

Here, examples of a mask design diagram and examples of raster data in which block patterns different from those shown in FIG. 4 are used will be described with reference to FIG. 5A to FIG. 6B.

Figure 5A:
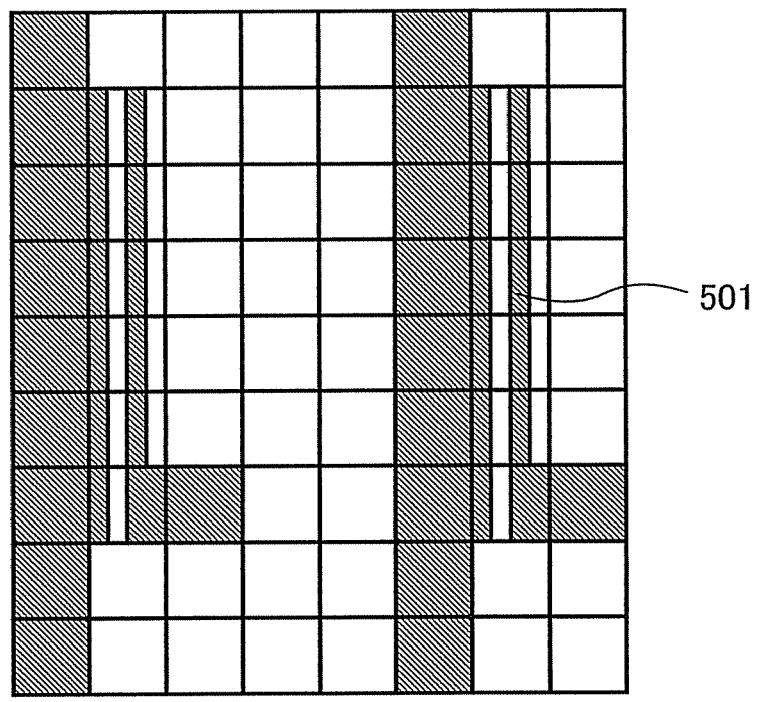
FIGS. 5A and 5B show an example of a mask design diagram and raster data.

FIG. 5A is a mask design diagram which is made using three kinds of block patterns B1, C1, D1 selected from the diagram registering library.

FIG. 5A is the mask design diagram when a source wiring and a drain electrode of a thin film transistor are formed with the ink-jet apparatus. A light shielding mask which has openings in places shown by shaded portions 501 in FIG. 5A is made.

Figure 5B:
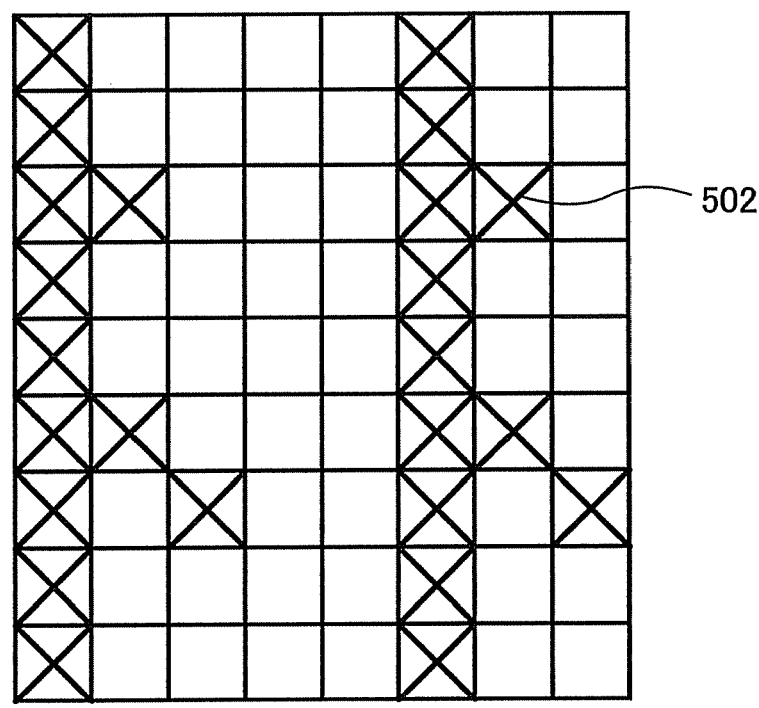

FIG. 5B shows an example of the raster data corresponding to FIG. 5A. Discharging is performed the same number of times (20) as the number of patterns to the places corresponding to the block pattern D1. Discharging is performed once for three continuous pitches to the places corresponding to the block pattern C1. Further, the most suitable pitches in the Y direction, that is, in the scanning direction of the head, of C1 and B1, are the same; therefore, discharging is performed once for each of four regions where three C1 and/or B1 in total are lined up. A droplet is discharged to each place so as to correspond to places 502 which are marked with X in FIG. 5B. 24 droplets in total are discharged in a section shown in FIG. 5B.

The surface treatment is performed to a substrate to be processed using the light shielding mask based on FIG. 5A, and a first region and a second region which have different wettabilities are formed. A droplet including the conductive material is discharged based on the raster data shown in FIG. 5B, whereby a desired source wiring and a desired drain electrode can be formed.

According to the present invention, a drain electrode which is narrower than the diameter of the droplet can be formed. Further, a distance between the source wiring and the drain electrode can be narrower than the diameter of the droplet.

Figure 6A:
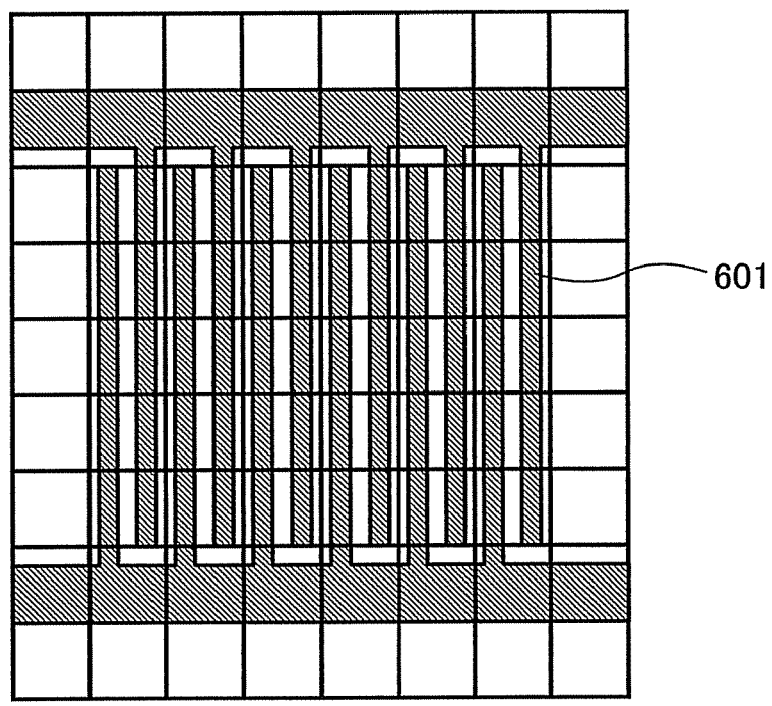
FIGS. 6A and 6B show an example of a mask design diagram and raster data.

A mask design diagram when two comb-shaped electrodes which are arranged so that the comb-shaped portions face each other are formed with the ink-jet apparatus is shown in FIG. 6A. FIG. 6A shows the mask design diagram made using five kinds of block patterns B2, E1, E2, F2, and F3 selected from the diagram registering library. A light shielding mask which has openings in places shown by shaded portions 601 in FIG. 6A is made.

Figure 6B:
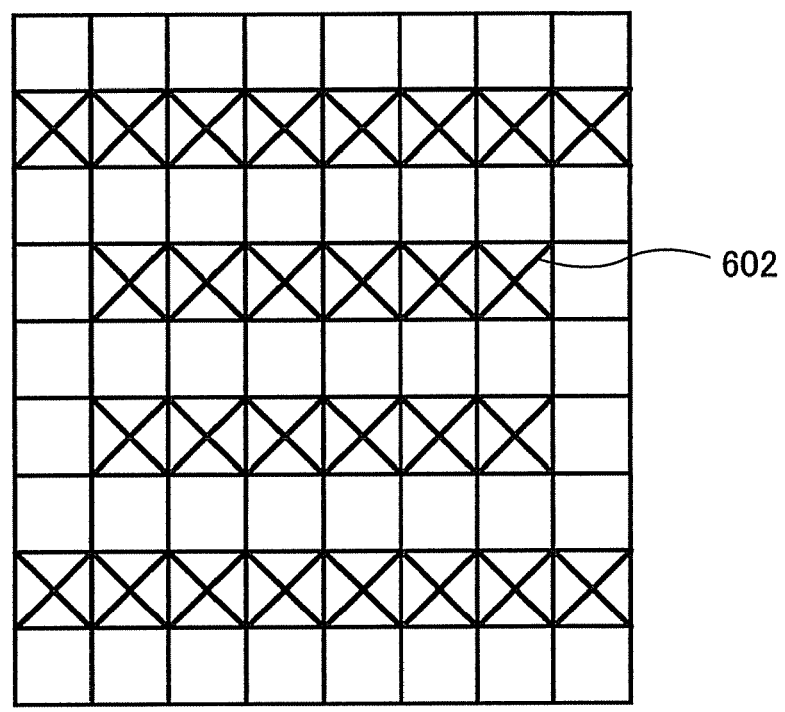

An example of the raster data corresponding to FIG. 6A is shown in FIG. 6B. Discharging is performed the same number of times as the number of patterns to the places corresponding to the block patterns E1, E2, F2, and F3. Discharging is performed twice for five continuous pitches to the places corresponding to the block pattern B2. A droplet is discharged to each place so as to correspond to places 602 which are marked with X in FIG. 6B. The surface treatment is performed to the substrate to be processed using the light shielding mask based on FIG. 6A, and a first region and a second region which have different wettabilities are formed. A droplet including a conductive material is discharged based on the raster data shown in FIG. 6B, whereby the two comb-shaped electrodes which are arranged so that the comb-shaped portions face each other can be formed.

According to the present invention, the comb-shaped electrodes which are narrower than the diameter of the droplet can be formed. Further, a distance between one comb-shaped electrode and the other comb-shaped electrode can be made narrower than the diameter of the droplet.

The block pattern B2 is preferably used when a plurality of wirings are arranged in the Y direction, that is, in a direction parallel to the scanning direction of the head. The pattern shapes which can be obtained with the droplet discharging apparatus also depend on the scanning direction of the head or the distance between the nozzles provided for the head; therefore, it is important to store a plurality of patterns capable of being obtained in the diagram registering library in advance.

For example, when the comb-shaped electrode is formed, a layout of a circuit design may be determined so as to be aligned with in the direction as shown in FIG. 6A. When the layout of the circuit is determined using a CAD tool and converted into the raster data, unless the mask is actually made based on the layout of the circuit, and droplet discharging is performed, it has been difficult to confirm whether the desired pattern can be obtained or to determine the most suitable number of discharging droplets. In the present invention, diagram blocks capable of being obtained by droplet discharging are stored in the diagram registering library in advance; therefore, the layout of the circuit which is formed by combining the diagram blocks can be obtained with the droplet discharging apparatus. Further, based on the diagram blocks, the most suitable number of discharging droplets which is necessary to make the raster data can also be determined.

Embodiment Mode 4

In Embodiment Mode 2, an example is shown where a droplet of a conductive material including a silver nanoparticle is discharged over the region where the negative type resist remains. Here, an example is shown where a droplet of a conductive material including a silver nanoparticle is discharged after a resist is removed.

First, a resist is applied over a surface to be processed. As a resist material, a positive type resist or a negative type resist is used. Here, as the surface to be processed, a plastic substrate is used, and as the resist material, the positive type resist is used.

Next, light exposure is performed using the mask formed in Embodiment Mode 1 as a light-exposure mask. The light-exposure mask is the light shielding mask having shielding portions in places shown by the shaded portions in FIG. 4A.

Next, the resist film is developed. Since the positive type resist is used, the resist in the region (the first region) where light exposure is performed is removed with a developer, and the resist in the region (the second region) where light exposure is not performed remains.

Next, surface treatment is performed so that the surface which is exposed is modified. For example, a surface which is exposed, that is, a region where a wiring is not formed (the first region) is a region having low wettability. In a later step, the droplet of the conductive material is discharged to a region where a wiring is formed (the second region), that is, a region having higher wettability than that of the first region.

Next, the positive type resist which remains in the second region is removed.

Next, the droplet of the fluid composition, here, the conductive material including a silver nanoparticle, is discharged over the second region. Here, the droplet discharging apparatus is driven using the raster data made in Embodiment Mode 1, and the droplet of the conductive material is selectively discharged.

As the droplet discharging apparatus, typically, the ink-jet apparatus is used. The ink-jet apparatus is provided with a head having an A number of nozzles (A is an integer of 2 or more) in a row, and droplets are discharged from different nozzles while changing a relative position between the head and an object to be processed, here the substrate. The ink-jet apparatus discharges a droplet of a material based on binarized or multi-valued data. After discharging, a wiring is formed by drying or baking.

Through the above steps, the pattern of the conductive material is formed. That is, a wiring mainly containing silver is formed over the plastic substrate. In this embodiment mode, similarly to Embodiment Mode 1, a wiring of which width is narrower than the diameter of the droplet landed can be formed, and further a distance between the adjacent wirings can also be narrower than the diameter of the droplet landed.

Compared with Embodiment Mode 1, Embodiment Mode 4 includes one more step of removing the positive resist after light exposure; however, in Embodiment Mode 4, the number of steps can be reduced compared to a conventional etching step.

The present invention having the above structure will be explained in more detail in embodiments below.

Embodiment 1

Figure 7A:
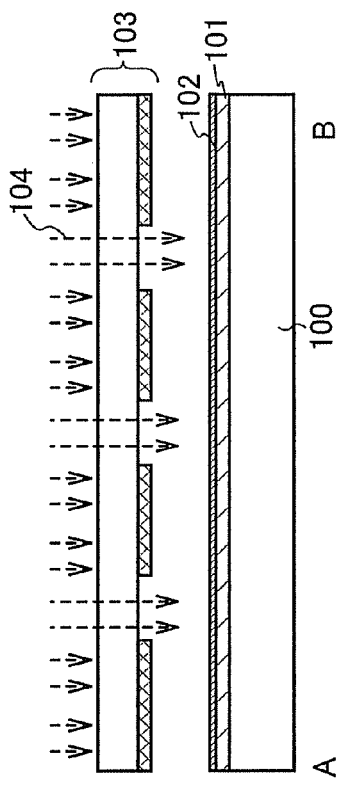
FIGS. 7A to 7F are process cross-sectional views and perspective views.
Figure 7B:
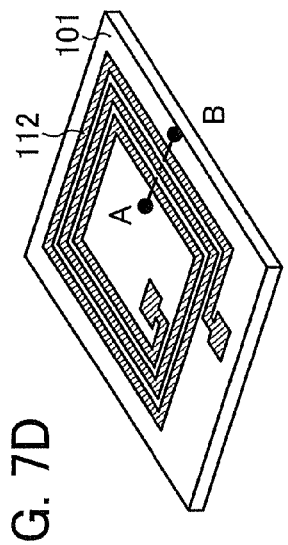
Figure 7C:
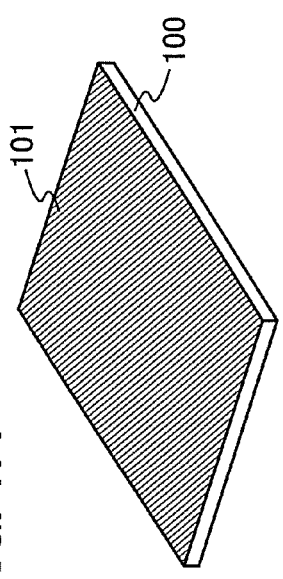
Figure 7D:
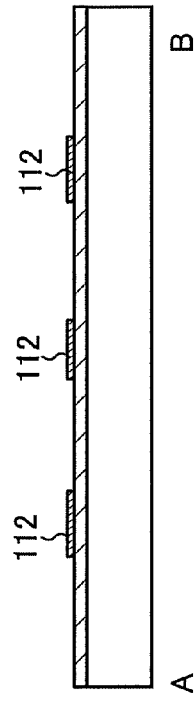
Figure 7E:
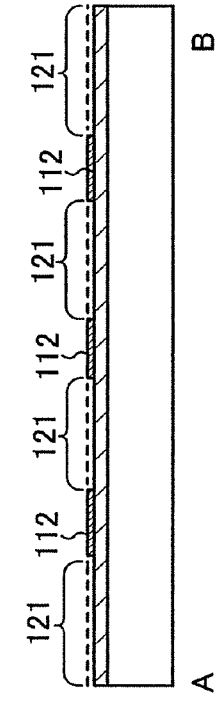
Figure 7F:
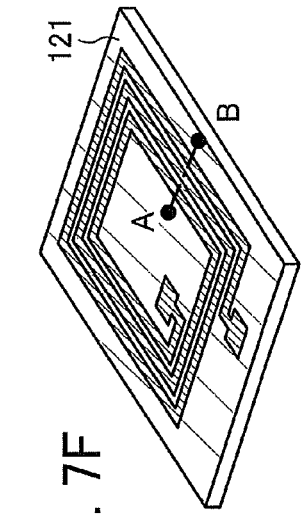

In this embodiment, a method for forming regions with different wettabilities over a substrate using a photomask, forming a conductive layer in the region with high wettability to form an antenna will be described with reference to FIGS. 7A to 8C. FIGS. 7A, 7D and 7F are perspective views of the substrate in a process of forming the antenna. FIGS. 7B, 7C and 7E are cross sectional views taken along a line A-B.

First, an inorganic insulating film 101 is formed over a substrate 100. As the substrate 100, a glass substrate or a quartz substrate may be used. A plastic substrate having heat resistance which can withstand the processing temperature may also be used. A silicon substrate may also be used other than the above-described substrates. Further, as the inorganic insulating film 101, a base film which is formed of an insulating film such as a silicon oxide film, a silicon nitride film, or a silicon oxynitride film is formed by a known method (e.g., a sputtering method, a LPCVD method, or a plasma CVD method). Here, an example in which a single layer structure is employed for the base film is shown; however, a structure of stacking two or more layers of the insulating film may also be employed. Note that, the base insulating film is not particularly required to be formed unless unevenness on the substrate or an impurity diffusion from the substrate becomes a problem.

Next, a photosensitive material film 102 is formed over the inorganic insulating film 101. The photosensitive material film 102 is formed by a spin coating method, a spray method, a printing method, a droplet discharging method, or the like. The photosensitive material film 102 is formed using a negative type resist material or a positive type resist material. In this embodiment, the photosensitive material film 102 is formed by a spin coating method using a solution in which polyvinyl cinnamate (PVCi) is dissolved in a solvent. Note that methyl ethyl ketone is used as the solvent and a solution in which the concentration of PVCi is 1 wt % is used. A material and a concentration of the solvent are not particularly limited. Thermal treatment is performed for ten minutes at a baking temperature of 120° C. and the solvent is vaporized. FIG. 7A shows a perspective view at this stage. Note that the inorganic insulating film is not shown in FIG. 7A.

Next, light exposure is selectively performed using a light-exposure mask 103. A part of the photosensitive material film 102 is irradiated with light 104 such as ultraviolet rays through openings of the light-exposure mask 103. A cross-linking reaction is caused in a region irradiated with the light 104 (the first region). FIG. 7B shows a condition of the light exposure. The light-exposure mask 103 is manufactured in accordance with a procedure shown in Embodiment Mode 1. For example, a mask is formed by combining the block pattern B2 and a block pattern A2 in the diagram registering library for a place where three lines of a conductive layer are arranged in a structure of the antenna.

Next, the photosensitive material film in a region which is not irradiated with light (the second region) is selectively removed using a developer. Here, dimethylformamide (DMF) or the like can be used as the developer. A cross sectional view at this stage corresponds to FIG. 7C and a perspective view at this stage corresponds to FIG. 7D.

Next, ozone is generated by irradiation of ultraviolet rays in an oxygen atmosphere to decompose and remove the photosensitive material remaining slightly in the second region. Here, so-called UV ozone treatment is performed for three minutes. By performing the ozone treatment, a repellent solution can be easily adsorbed to the second region when the repellent solution is formed later.

Next, the substrate is exposed to hexamethyldisilazane (HMDS) vapor, whereby HMDS is adsorbed to the second region where the inorganic insulating film is exposed. In this manner, as shown in a cross sectional view at a stage of FIG. 7E and a perspective view of FIG. 7F, a surface 121 having a repellent property is formed by adsorption of HMDS. Note that HMDS is also attached slightly over the photosensitive material film 112 after light exposure in some cases.

Figure 8A:
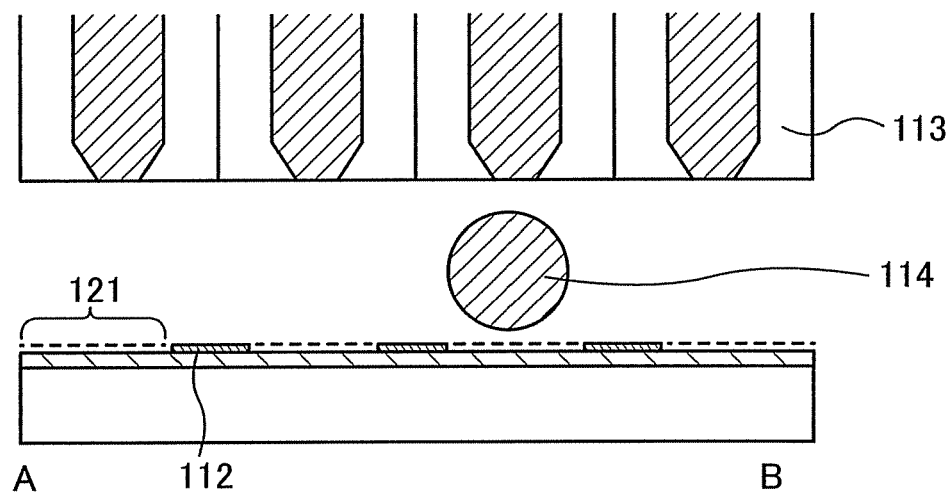
FIGS. 8A to 8C are process cross-sectional views and a perspective view.
Figure 8B:
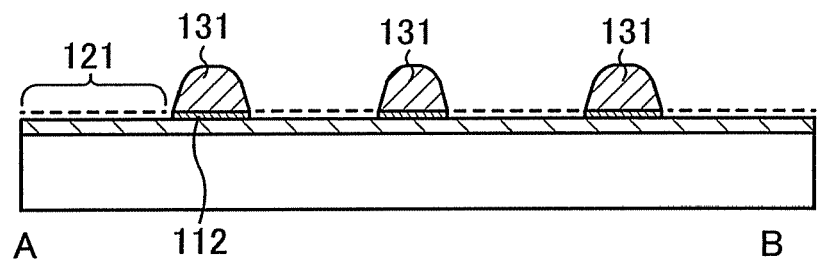
Figure 8C:
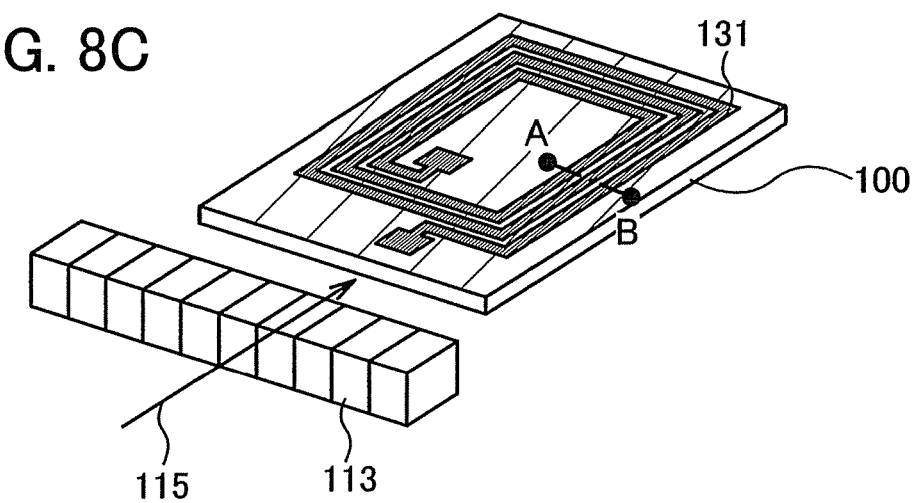

Next, in accordance with the most suitable discharging position and the most suitable number of discharging droplets which are obtained by the diagram registering library, the droplet of the fluid composition, here, the conductive material including a silver nanoparticle, is discharged over the first region. As a liquid of the conductive material including a silver nanoparticle, a solution is used in which the silver nanoparticle is dispersed into diethylene glycol monobutyl ether and the concentration of the silver nanoparticle is 20 wt %. FIG. 8A is a cross sectional view in the middle of discharging the droplet. As shown in FIG. 8A, a diameter of a droplet 114 in flight is larger than a width of the first region, that is, a line width of the antenna. The area of the droplet 114 on the surface to be processed right after the droplet 114 lands the surface to be processed is larger than the diameter of the droplet 114 in flight. The droplet 114 lands the surface to be processed, and after a while, the liquid over the second region which has the surface having a repellent property moves to the first region, so that a state shown in FIG. 8B can be obtained. Further, FIG. 8C is a perspective view at a stage where a scanning of the head 113 is completed. Here, an example is shown where scanning is performed one time by moving the substrate 100 in a direction of an arrow shown in FIG. 8C, that is, a printing direction 115; however, the present invention is not particularly limited thereto. Further, here, the example is shown where the head 113 has a width in a longitudinal direction of the substrate, which is longer than one side of the substrate; however, the present invention is not particularly limited thereto. When a plurality of antennas are formed over a large-area substrate, a plurality of heads are prepared, and scanning is performed a plurality of times, whereby droplets may be discharged to one large-area substrate.

Next, drying and baking is performed. Here, drying is performed for ten minutes at a temperature of 120° C., and then baking is performed for thirty minutes at a temperature of 200° C. In this manner, a wiring 131 of which width is narrower than the diameter of the droplet 114 can be obtained.

Further, as shown in FIG. 8A, in spite that a distance between the nozzles of the head 113, that is, the distance between the droplet discharging outlets is larger than a distance between the wirings of the antenna, the antenna where the distance between the wirings is narrower can be formed.

In this embodiment, an example is shown where PVCi which is a negative type photosensitive material is used; however, a positive type photosensitive material can also be used. For example, a novolac diazonaphthoquinone resist can be used. As a developer in this case, tetramethylammonium hydroxide (TMAH) may be used. However, when the positive type photosensitive material is used, the above-described light-exposure mask cannot be used. When the positive type photosensitive material is used, a light-exposure mask is used where positions of the opening portion and the shaded portion of the mask used for exposing the negative type photosensitive material to light are inverted.

This embodiment can be freely combined with any one of Embodiment Modes 1 to 4.

Embodiment 2

In Embodiment 1, an example where the antenna is formed is shown. In this embodiment, an example is shown where a transistor is manufactured.

Figure 9:
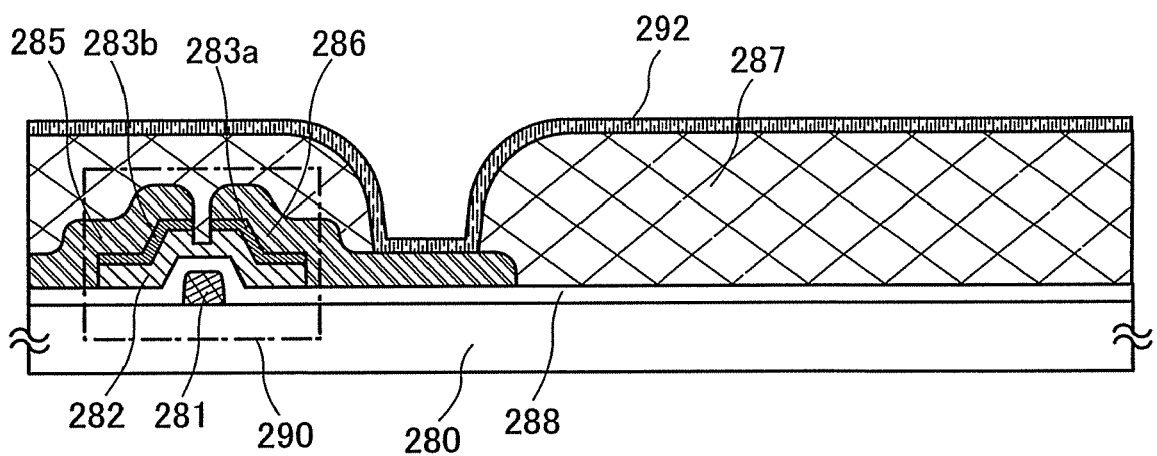
FIG. 9 is a cross sectional view of a transistor.

FIG. 9 shows an example of a cross sectional view of an inversely-staggered thin film transistor. The inversely-staggered transistor 290 is provided over a substrate 280 having an insulating surface. The transistor 290 includes an insulating layer 288, a gate electrode layer 281, a semiconductor layer 282, a semiconductor layer 283a having one conductivity type, a semiconductor layer 283b having one conductivity type, a source electrode layer 285, and a drain electrode layer 286.

First, the gate electrode layer 281 is formed over the substrate 280 having the insulating surface. As the substrate 280, a light-transmitting substrate, for example, a glass substrate, a crystallized glass substrate, or a plastic substrate can be used. As the plastic substrate, a plastic film substrate, for example, a plastic substrate of polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like is preferably used. In addition, a plastic substrate having heat resistance, for example, a plastic substrate in which a material where inorganic particles with a diameter of several nm are dispersed into an organic polymer matrix is processed in a sheet may also be used.

The gate electrode layer 281 can be formed by a droplet discharging method. Further, the gate electrode layer 281 where the width of the gate electrode is narrow can also be formed by the method described in Embodiment Mode 1. For example, when the diameter of the droplet landed is 55 μm, the line width of the gate electrode layer 281 can be 25 μm. If the case of a double gate structure, a distance between the adjacent gate electrode layers 281, that is, a distance between two channel formation regions in one transistor, can be 15 μm.

Next, an insulating layer 288 covering the gate electrode layer 281 is formed. As the insulating layer 288, an insulating film such as a silicon oxide film, a silicon nitride film, or a silicon oxynitride film is used. In addition, as the insulating layer 288, a film that is obtained by coating and baking a solution containing polysilazane or a siloxane polymer, a photo-curing organic resin film, a thermosetting organic resin film, or the like may also be used. The insulating layer 288 functions as a gate insulating film of the transistor 290.

Then, a semiconductor film and the semiconductor film having one conductivity type are stacked. As the semiconductor film, various semiconductors such as an amorphous semiconductor, a crystalline semiconductor, a polycrystalline semiconductor, or a microcrystalline semiconductor can be used that is manufactured by a vapor deposition method with the use of a semiconductor material gas typified by silane and germane, a sputtering method, or a thermal CVD method. In addition, as the semiconductor film, ZnO or oxide of zinc gallium indium manufactured by a sputtering method or a PLD (Pulse laser Deposition) method may also be used; however, in that case, the gate insulating film is preferably an oxide containing aluminum or titanium. Moreover, as the semiconductor film, an organic material such as pentacene, tetracene, a thiophen oligomer derivative, a phenylene derivative, a phthalocyanine compound, a polyacetylene derivative, a polythiophene derivative, or a cyanine dye, manufactured by a coating method, a droplet discharging method, or a vapor deposition method, may also be used to form an organic transistor.

As the semiconductor film having one conductivity type, a semiconductor film exhibiting n-type or p-type conductivity in which an n-type or a p-type impurity is added is used. The semiconductor film having one conductivity type may be formed by a PCVD method with the use of a silane gas and a phosphine gas. Note that, in the case of using an organic material such as pentacene as the semiconductor film, a charge transporting layer may be used instead of the semiconductor film having one conductivity type and, for example, triphenyldiamine serving as a hole transporting layer or oxadiazole serving as an electron transporting layer may be used.

Next, an island-shape semiconductor layer 282 and semiconductor layers 283a and 283b having one conductivity type are obtained by patterning with the use of a known photolithography technique. Note that a mask may be formed using a droplet discharging method or a printing method (such as relief printing, planography, intaglio printing, or screen printing) and etching may be performed selectively, instead of the known photolithography technique.

Next, the source electrode layer 285 and the drain electrode layer 286 are formed. The source electrode layer 285 and the drain electrode layer 286 can be formed by a droplet discharging method. Further, the source electrode layer 285 and the drain electrode layer 286 where the electrode widths are narrow can also be formed using the method described in Embodiment Mode 1. For example, a light-exposure mask shown in FIG. 5A is manufactured in accordance with a procedure described in Embodiment Mode 3, the source electrode layer 285 and the drain electrode layer 286 where a distance between the electrodes is narrow are formed with the droplet discharging apparatus. For example, when the diameter of the droplet landed is 55 μM, the line widths of the source electrode layer 285 and the drain electrode layer 286 can be each 25 μm. Further, a distance between the source electrode layer 285 and the drain electrode layer 286 can be 15 μm.

Next, the semiconductor layers having one conductivity type and an upper portion of the semiconductor layer are etched using the source electrode layer 285 and the drain electrode layer 286 as masks to expose a part of the semiconductor layer. The exposed portion of the semiconductor layer is a portion serving as a channel formation region of the TFT.

Next, an interlayer insulating film 287 including a protective film for preventing the channel formation region from being contaminated with impurities is formed. As the protective film, a material containing silicon nitride or silicon nitride oxide as its main component is used which is obtained by a sputtering method or a PCVD method. In this embodiment mode, hydrogenation treatment is performed after forming the protective film. In addition, as the interlayer insulating film, a resin material such as epoxy resin, acrylic resin, phenol resin, novolac resin, melamine resin, or urethane resin is used. Moreover, an organic material such as benzocyclobutene, parylene, or polyimide having transmissivity; a compound material made by polymerization of a siloxane-based polymer or the like; a composition material containing a water-soluble homopolymer and a water-soluble copolymer; or the like can be used.

Next, the interlayer insulating film 287 is selectively etched to form an opening which reaches the drain electrode layer 286.

Next, a conductive layer 292 which is electrically connected to the drain electrode layer 286 is formed.

An active matrix liquid crystal display device can be manufactured with the use of the conductive layer 292 as a pixel electrode. Further, an active matrix light-emitting display device can also be manufactured by forming a partition covering an end portion of the conductive layer 292 and stacking an electrode and a layer containing an organic compound over the conductive layer 292.

Any one of the gate electrode layer 281, the source electrode layer 285, the drain electrode layer 286, and the conductive layer 292 can be formed with the droplet discharging apparatus by the methods described in Embodiment Modes 1 to 4. The number of steps can be reduced by using the methods described in Embodiment Modes 1 to 4.

In FIG. 9, an example is shown where the inversely-staggered thin film transistor is provided over the substrate 280 having an insulating surface. A staggered type or a planar type transistor can also be formed.

In this embodiment, an example is shown where the transistor is manufactured; however, the present invention is not particularly limited to this. Other semiconductor elements, resistors, memory elements (a nonvolatile memory, a read only memory (ROM), or the like), batteries in a film form, or the like can be manufactured using the present invention.

This embodiment can be freely combined with any one of Embodiment Modes 1 to 4. Further, this embodiment can be freely combined with Embodiment 1.

Embodiment 3

An IC chip is electrically connected to the antenna manufactured in Embodiment 1, whereby the IC chip can be used as a non-contact thin film integrated circuit device (also referred to as a wireless IC tag or RFID (Radio Frequency Identification)).

Figure 10:
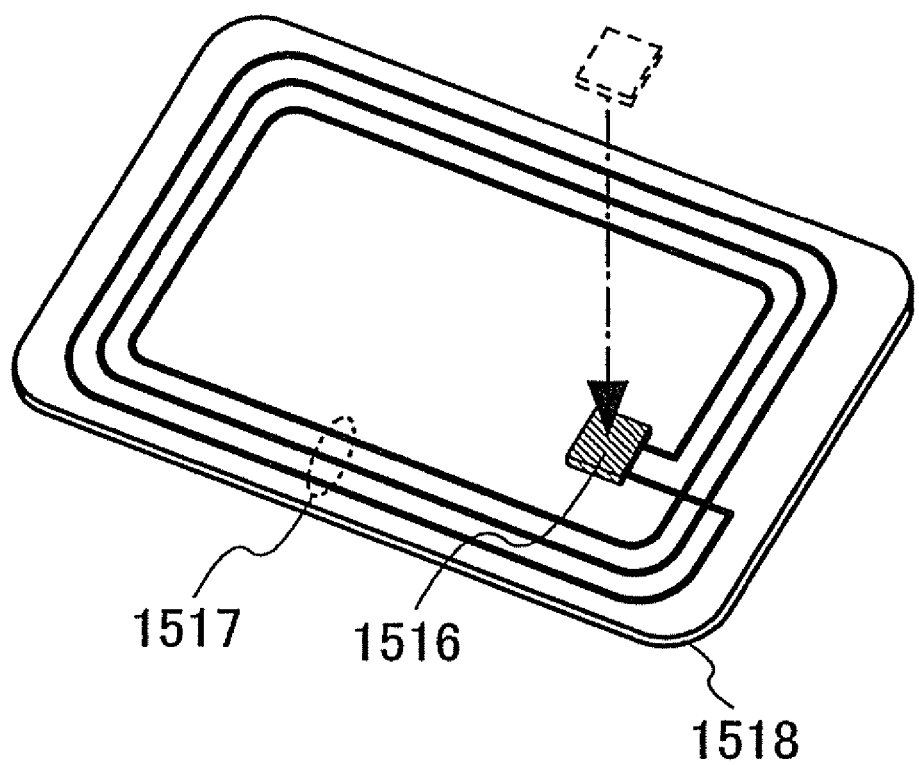
FIG. 10 is a perspective view showing a card having an antenna.
Figure 11A:
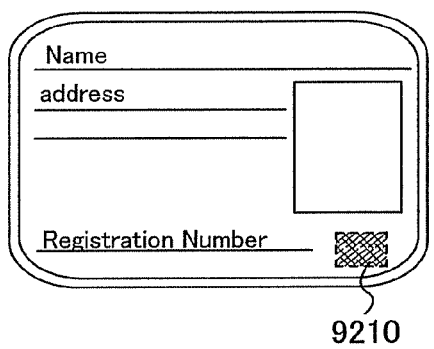
FIGS. 11A to 11F are examples of electronic appliances.
Figure 11B:
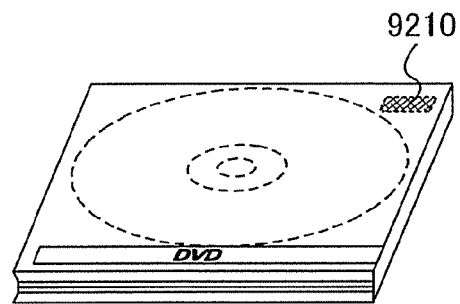
Figure 11C:
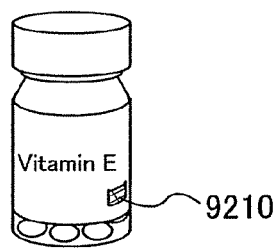
Figure 11D:
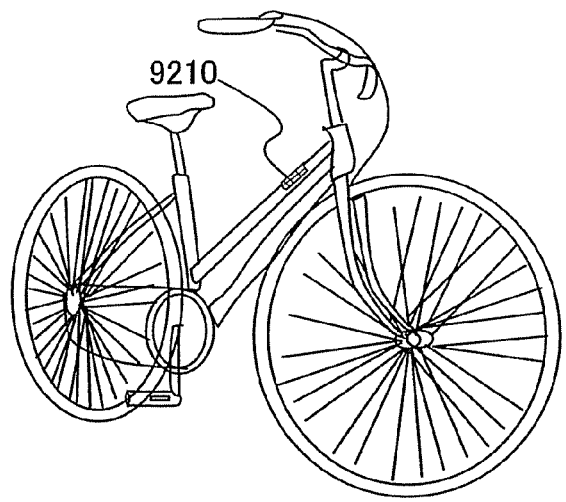
Figure 11E:
Figure 11F:
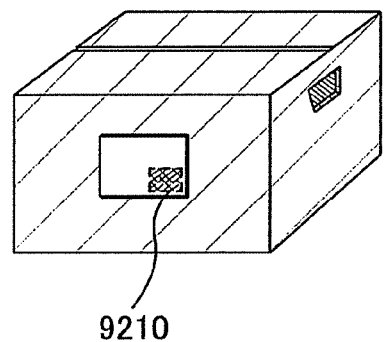

FIG. 10 shows an example of an ID card in which an IC chip 1516 is attached to a card-like substrate 1518 provided with a conductive layer 1517 serving as the antenna manufactured in Embodiment 1. The conductive layer 1517 serving as the antenna is formed by a droplet discharging method. Thus, the IC chip 1516 is small, thin, and lightweight, so that a variety of applications can be realized and the design of an article is not degraded even when the IC chip is attached to the article.

Note that the IC chip 1516 is not limited to the case of being attached to the card-like substrate 1518. The IC chip 1516 can be attached to an article having a curved surface or various shapes. FIGS. 11A to 11F show examples thereof. For example, the IC chips can be provided for articles such as bills, coin, securities, bearer bonds, certificates (such as a driver's license, a resident's card, or the like, see FIG. 11A), packaging containers (e.g., wrapping paper or bottles, see FIG. 11C), memory media (such as a DVD or a video tape, see FIG. 11B), vehicles (such as a bicycle, see FIG. 11D), belongings (such as a bag or glasses), food, plants, animals, human bodies, clothing, livingwares, tags on goods such as electronic appliances or on luggage (see FIGS. 11E and 11F), and the like. The electronic appliances correspond to a liquid crystal display device, an EL display device, a television device (also referred to as a TV simply, a TV receiver, or a television receiver), a mobile phone, and the like.

A wireless chip is attached to the surface of the article or incorporated in the article to be fixed. For example, the wireless chip may be incorporated in a paper of a book, or an organic resin of a package. When the wireless chip is incorporated in bills, coins, securities, bearer bonds, certificates, and the like, forgery thereof can be prevented. In addition, when a wireless chip is incorporated in packaging containers, memory media, belongings, foods, clothes, livingware, electronic appliances, and the like, efficiency of an inspection system, a rental system, and the like can be increased. A wireless chip which can be formed using the present invention is obtained in such a manner that a thin film integrated circuit formed over a substrate is peeled off by a known peeling step and then attached to a cover material; therefore, the wireless chip is small, thin, and lightweight, so that the design of an article is not degraded even when the IC chip is attached to the article. In addition, since such a wireless chip has flexibility, the wireless chip can be attached to an object having a curved surface, such as bottles and pipes.

When a wireless chip which can be formed using the present invention is applied to product management and a distribution system, high-performance system can be achieved. For example, when information stored in a wireless chip mounted on a tag is read by a reader/writer provided beside a conveyor belt, information such as a distribution process and a delivery address is read out, so that inspection of a product or distribution of a luggage can be easily performed.

The IC chip can also be formed using a TFT other than using a chip which is cut out from the semiconductor substrate. For example, a circuit may be formed using a plurality of TFTs shown in Embodiment 2. When a TFT is used, a circuit and an antenna can also be formed over the same substrate.

This embodiment can be freely combined with any one of Embodiment Modes 1 to 4. Further, this embodiment can be freely combined with Embodiment 1 or Embodiment 2.

Embodiment 4

Figure 12:
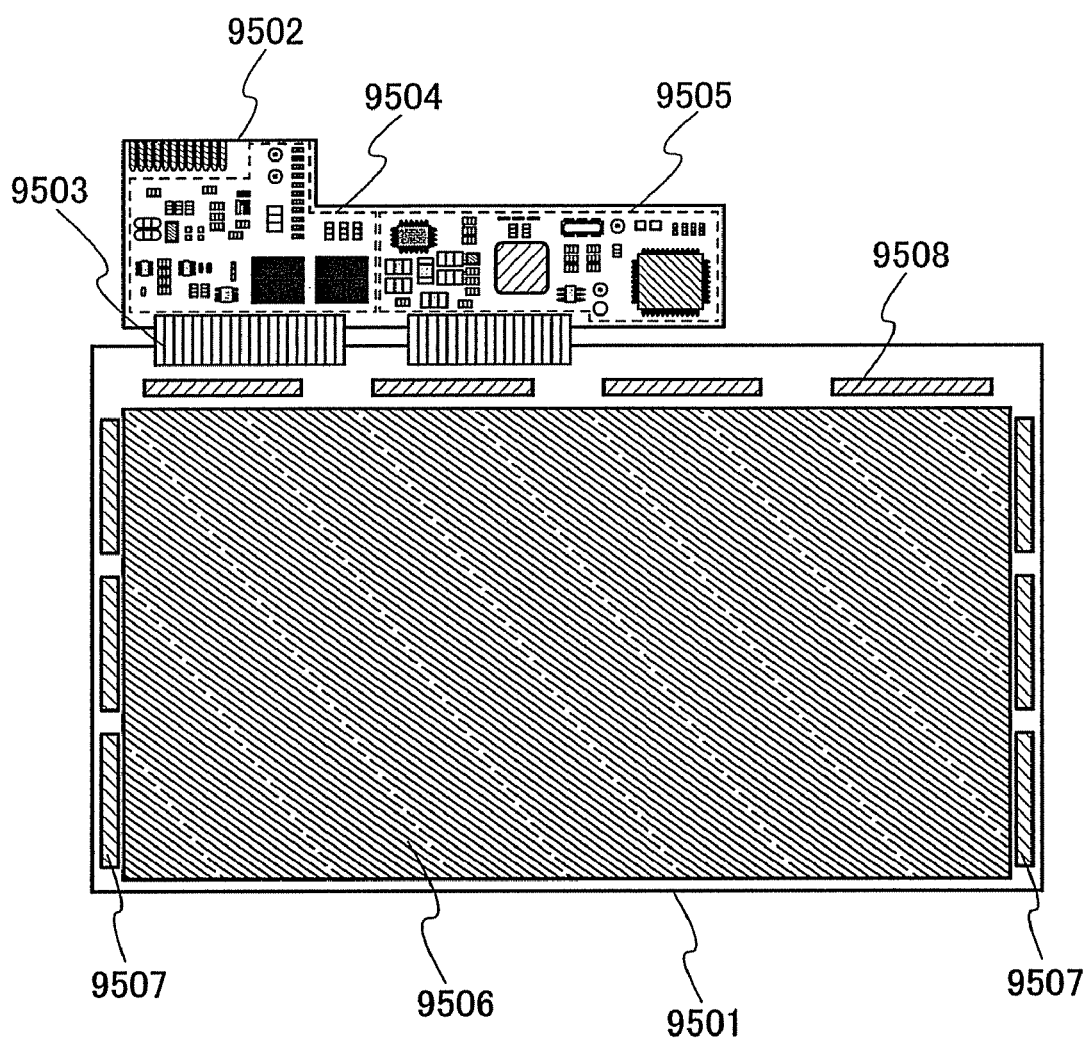
FIG. 12 is an example of an electronic appliance.

In this embodiment, when an active matrix display panel is manufactured, a module having a display panel in which TFTs manufactured in Embodiment 2 are used as switching elements will be explained with reference to FIG. 12. FIG. 12 shows a module where a display panel 9501 and a circuit substrate 9502 are combined.

For example, a control circuit 9504, a signal dividing circuit 9505, and the like are formed over the circuit substrate 9502. The display panel 9501 and the circuit substrate 9502 are connected to each other with a connection wiring 9503. A liquid crystal display panel and a light-emitting display panel using TFT as shown in Embodiment 2 can be used appropriately for the display panel 9501.

The display panel 9501 includes a pixel portion 9506 where a light-emitting element is provided in each pixel, a scanning-line driver circuit 9507, and a signal-line driver circuit 9508 that supplies a video signal to a selected pixel. A TFT in the pixel portion 9506 is formed in accordance with Embodiment 2. As the scanning-line driver circuit 9507 and the signal-line driver circuit 9508, IC chips are mounted on the substrate by a known mounting method using an anisotropic conductive adhesive or an anisotropic conductive film, a COG method, a wire bonding method, reflow treatment using a solder bump, or the like.

According to this embodiment, a display module can be formed at low cost.

In FIG. 12, a liquid crystal display module is shown as an example of the display module; however, the present invention is not limited thereto. The present invention can be appropriately applied in forming wiring of a display module such as a light-emitting display module, a DMD (Digital Micromirror Device), a PDP (Plasma Display Panel), an FED (Field Emission Display), an electrophoretic display device (electronic paper), or an electro deposition image display device.

As an electronic appliances having a semiconductor device in which a wiring or a TFT is formed using the present invention, a television device (also simply referred to as a TV or a television receiver) can be given. Here, a specific example of a television device will be explained with reference to FIGS. 13A and 13B.

Figure 13A:
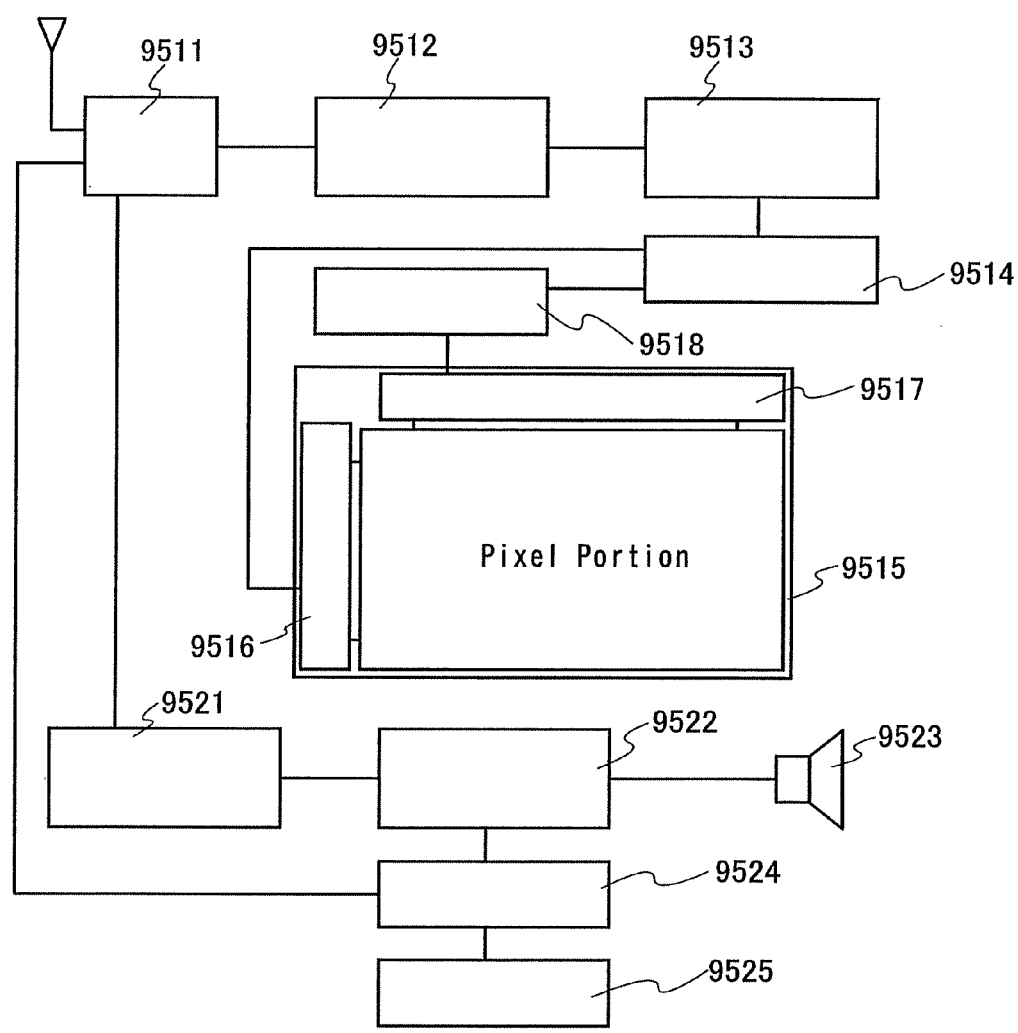
FIGS. 13A and 13B are an example of an electronic appliance.
Figure 13B:
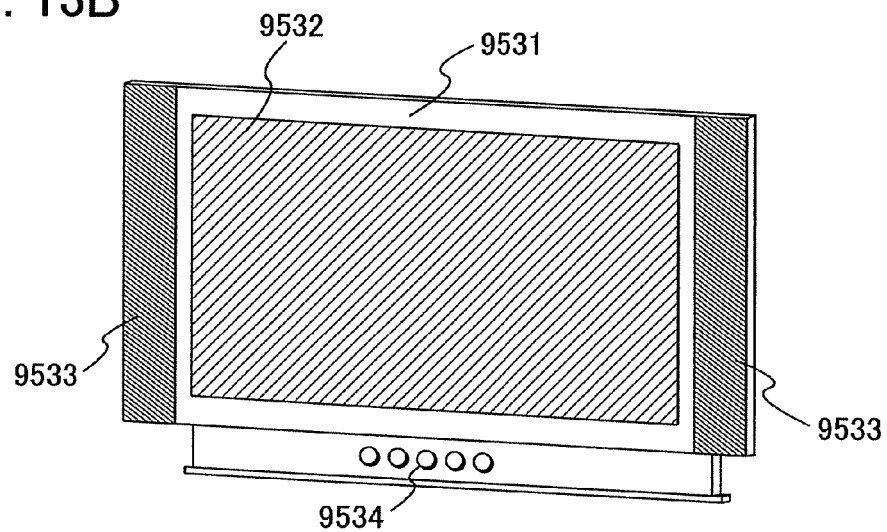

FIG. 13A shows a block diagram of a television device, while FIG. 13B shows a perspective view of a television device. A liquid crystal television device and an EL television device can be completed by using the display module shown in the above embodiment.

FIG. 13A is a block diagram showing main components of a television device. A tuner 9511 receives a video signal and an audio signal. The video signal is processed by a video detection circuit 9512, a video signal processing circuit 9513 that converts a signal outputted from the video detection circuit into a chrominance signal corresponding to each of red, green, and blue, and a control circuit 9514 that converts the video signal in accordance with input specifications of a driver IC. The control circuit 9514 outputs a signal to a scanning-line driver circuit 9516 and a signal-line driver circuit 9517 of a display panel 9515. In the case of digital driving, a signal division circuit 9518 may be provided on the signal line side, so that an inputted digital signal is divided into m signals to be supplied.

Among signals received by the tuner 9511, an audio signal is transmitted to a sound detection circuit 9521, and an output thereof is supplied to a speaker 9523 through an audio signal processing circuit 9522. A control circuit 9524 receives control information of a receiving station (received frequency) and a sound volume from an input portion 9525, and transmits signals to the tuner 9511 and the audio signal processing circuit 9522.

As shown in FIG. 13B, a television device can be completed by incorporating a module in a housing 9531. A display screen 9532 is formed using a module typified by a liquid crystal module. In addition, a speaker 9533, operating switches 9534, and the like are appropriately provided.

Since this television device includes the display panel 9515, cost reduction thereof can be achieved. In addition, the television device capable of high-definition display can be manufactured.

The present invention is not limited to the television receiver. The present invention can be applied to various applications as a monitor for a personal computer, a display medium with a large area such as an information display panel at stations or airports, and an advertisement display panel on the street.

This embodiment can be freely combined with any one of Embodiment Modes 1 to 4. Further, this embodiment can be freely combined with Embodiment 1 or Embodiment 2.

According to the present invention, since the number of etching steps by a photolithography technique can be reduced, the loss and the amount of waste liquid of the material liquid can be reduced. Further, the present invention can provide a droplet discharging process suitable for a case where the material layer has a complex pattern. In addition, the present invention can realize a manufacturing process with the use of a droplet discharging method suitable for a large-sized substrate in mass production.

This application is based on Japanese Patent Application serial no. 2006-351985 filed with Japan Patent Office on Dec. 27, 2006, the entire contents of which are hereby incorporated by reference.

What is claimed is:

1. A method for manufacturing a semiconductor device comprising the steps of:
    measuring a diameter of a droplet landed on a surface with a droplet discharging apparatus;
    determining a rectangular component having a side with a length, wherein the length is shorter than the diameter of the droplet;
    making a data map where a plurality of the rectangular components are arranged in an X coordinate and a Y coordinate by dividing an area which corresponds to an area of a substrate with the rectangular component;

designing a circuit by selecting a diagram block from a diagram registering library including plural kinds of diagram blocks corresponding to binary data;

arranging the diagram blocks in the data map to make a diagram data map;

making a light-exposure mask based on the diagram data map;

forming a first region and a second region which have different wettabilities over the substrate using the light-exposure mask;

making a raster data based on the diagram data map and the diagram registering library; and discharging a droplet in the first region with the droplet discharging apparatus in accordance with the raster data.

2. The method for manufacturing a semiconductor device according to claim 1, wherein the plural kinds of diagram blocks determined in advance are stored in the diagram registering library.

3. The method for manufacturing a semiconductor device according to claim 1, wherein the first region has a lyophilic property, and the second region has a repellent property.

4. The method for manufacturing a semiconductor device according to claim 1, wherein one side of the rectangular component is greater than or equal to 50% and less than 90% of the diameter of the droplet.

5. The method for manufacturing a semiconductor device according to claim 1, wherein the diagram registering library includes at least a first diagram block and a second diagram block;

wherein the first diagram block is a portion where a wiring of which width is wider than the diameter of the droplet is arranged; and wherein the second diagram block is a portion where a wiring of which width is narrower than the diameter of the droplet is arranged.

6. A method for manufacturing a semiconductor device comprising the steps of:

making a light-exposure mask based on a diagram data map;

forming a first region and a second region which have different wettabilities over a substrate using the light-exposure mask;

making a raster data based on the diagram data map and a diagram registering library; and discharging a droplet in the first region with the droplet discharging apparatus in accordance with the raster data, wherein the diagram data map is made by designing a circuit by selecting a diagram block from the diagram registering library including plural kinds of diagram blocks corresponding to binary data and arranging the diagram blocks in a data map where a plurality of rectangular components are arranged in an X coordinate and a Y coordinate by dividing an area which corresponds to an area of the substrate with one of the rectangular components having a side with a length that is shorter than the diameter of the droplet.

7. The method for manufacturing a semiconductor device according to claim 6, wherein the plural kinds of diagram blocks determined in advance are stored in the diagram registering library.

8. The method for manufacturing a semiconductor device according to claim 6, wherein the first region has a lyophilic property, and the second region has a repellent property.

9. The method for manufacturing a semiconductor device according to claim 6, wherein one side of the rectangular component is greater than or equal to 50% and less than 90% of the diameter of the droplet.

10. The method for manufacturing a semiconductor device according to claim 6, wherein the diagram registering library includes at least a first diagram block and a second diagram block;

wherein the first diagram block is a portion where a wiring of which width is wider than the diameter of the droplet is arranged; and wherein the second diagram block is a portion where a wiring of which width is narrower than the diameter of the droplet is arranged.

* * * * *

UNITED STATES PATENT AND TRADEMARK OFFICE
CERTIFICATE OF CORRECTION

| | | |
|---|---|---|
| PATENT NO. | : 7,827,521 B2 | Page 1 of 1 |
| APPLICATION NO. | : 11/964251 | |
| DATED | : November 2, 2010 | |
| INVENTOR(S) | : Gen Fujii and Erika Takahashi | |

It is certified that error appears in the above-identified patent and that said Letters Patent is hereby corrected as shown below:

<u>In The Specification</u>:

-- column 2, line 5: "inkjet" should be changed to -- ink-jet --;

-- column 2, line 8: "inkjet" should be changed to -- ink-jet --;

-- column 2, line 60: "inkjet" should be changed to -- ink-jet --;

--column 9, line 13: "inkjet" should be changed to -- ink-jet --;

-- column 14, line 49: "PLD (Pulse laser Deposition)" should be changed to -- PLD (Pulse Laser Deposition --;

<u>In The Claims</u>:

-- claim 1, column 18, line 66: after "plurality of" delete "the;"

-- claim 6, column 20, line 15: "plurality of" should be added between "the" and "rectangular"

-- claim 6, column 20, line 17: after "than" delete "the" and insert -- a --;

-- claim 9, column 20, line 26: "one of the plurality of" should be added between "the" and "rectangular"

-- claim 9, column 20, line 27: delete "component" and insert -- components --.

Signed and Sealed this
Tenth Day of May, 2011

David J. Kappos
*Director of the United States Patent and Trademark Office*